United States Patent [19]

Forrest et al.

[11] 4,414,066
[45] Nov. 8, 1983

[54] ELECTROCHEMICAL PHOTOETCHING OF COMPOUND SEMICONDUCTORS

[75] Inventors: Stephen R. Forrest; Paul A. Kohl, both of Chatam; Richard L. Panock, Cranford, all of N.J.

[73] Assignee: Bell Telephone Laboratories, Incorporated, Murray Hill, N.J.

[21] Appl. No.: 416,472

[22] Filed: Sep. 10, 1982

[51] Int. Cl.³ .............................................. C25F 3/12
[52] U.S. Cl. ........................... 204/129.3; 204/129.75
[58] Field of Search ........... 204/129.3, 129.65, 129.75, 204/129.8

[56] References Cited

U.S. PATENT DOCUMENTS 4,194,954 3/1980 Faktor ............................ 204/129.3
4,351,706 9/1982 Chappell ........................ 204/129.65

OTHER PUBLICATIONS

Patent Application Kohl et al. 5-5, Ser. No. 223,356, filed Jan. 8, 1981.
Patent Application Kohl et al. 7-7-7, Ser. No. 275,245, filed Jun. 19, 1981.
Patent Application Kohl et al. 8-8, Ser. No. 275,805, filed Jun. 22, 1981.

*Primary Examiner*—T. M. Tufariello
*Attorney, Agent, or Firm*—Walter G. Nilsen

[57] ABSTRACT

A procedure is described for electrochemically photoetching n-type and intrinsic compound semiconductors. The process involves applying a potential to the compound semiconductor while it is in contact with an electrolytic solution and irradiating the surface to be etched with light in a certain energy range. By suitable adjustment in the potential, electrolytic solution composition and light energy, the etch rate is made proportional to the light intensity. By suitable variation in light intensity and light-ray direction, various geometrical features can be made on the surface of the compound semiconductor. For example, a hole with straight sides can be made in the compound semiconductor by use of a light spot and parallel (collimated) light rays. An advantageous application of this process is the fabrication of a photodiode with a hole in the center for use in bidirectional communication systems and to monitor power output for optical communication sources. The advantage of this process is that no damage occurs outside etched hole so that a maximum area of the photodiode remains active for detecting incoming radiation. Another advantage of the process is that etching will stop where the material becomes p-type so that etching can be made to stop automatically at a p/n junction.

26 Claims, 3 Drawing Figures

ELECTROCHEMICAL PHOTOETCHING OF COMPOUND SEMICONDUCTORS

TECHNICAL FIELD

The invention is a procedure for etching damage-free holes in n-type and intrinsic semiconductor compounds.

BACKGROUND OF THE INVENTION

The development of III-V semiconductor compounds have made possible the fabrication of a variety of devices useful in industrial applications. Typical devices are lasers, light emitting diodes, detectors of various kinds including light detectors, memories, etc. Proper exploitation of the properties of these III-V compounds requires processing procedures often unique to semiconducting compounds. Typically, these techniques are directed toward smaller sized, more precise location of various features on the semiconductor material, unique geometrical features useful only with compound semiconductors, etc.

A particular case in point is the production of various geometrical features on compound semiconductors. For example, it is often required to etch a straight-walled hole in a semiconductor compound. Such a feature is often difficult to make because of the isotropic nature of most etching processes. In addition, for many optical devices, damage-free etching is preferred so as to minimize undesirable damage to the active areas of the device.

In fabricating such devices, particularly optical devices, it would be highly advantageous to have an etching procedure which can be controlled as to etch rate, area to be etched and geometrical shape to be etched. It is also highly advantageous that such procedures produce damage-free features, particularly where the etching procedure involves material close to or part of the active area of the device. Such a procedure would be useful for making channels or holes in various optical devices such as optical detectors.

It is also useful to have the etching process depend on semiconductor properties. For example, it is often advantageous that only n-type and intrinsic material be etched and not p-type material.

SUMMARY OF THE INVENTION

The invention is an electrochemical procedure for photoetching n-type or intrinsic compound semiconductors. The procedure involves making the compound semiconductor part of an oxidation-reduction electrochemical process in an electrolytic solution; applying a potential to the compound semiconductor relative to a standard electrode and illuminating the area to be etched with light of sufficient energy to create holes in the valence band. The bias potential is chosen so that the holes participate in an oxidation-reduction reaction. The bias potential of the compound semiconductor (potential of compound semiconductor relative to a saturated KCl calomel electrode, SCE) should be between precise limits which depend on the particular compound semiconductor being etched (including extent and type of doping) and the composition of the electrolytic solution in which the etching is done. Throughout this work, potentials are expressed with reference to the saturated KCl calomel electrode (SCE). To convert a particular potential from the SCE reference to the standard hydrogen electrode reference, add 0.242 volts. In general, the potential should be between the valence band maximum and the conduction band minimum for the particular compound semiconductor in the particular electrolytic solution being used. Since the rate of etching is proportional to light intensity, certain geometrical features can be made by varying light intensity across the surface being etched. Also, light direction can be used to effect geometrical shapes. Specifically, collimated light can be used to obtain straight-walled slots or holes. This procedure is particularly useful for "drilling" holes in photodiodes so that a single fiber can be used in a bidirectional communication system or a monitoring system for optical sources. This procedure yields damage-free structural features which is highly advantageous for many optical applications. For example, for the hole in the photodetector mentioned above, damage-free etch insures minimum degradation of the characteristics of the photodetector when the hole is etched in it.

DETAILED DESCRIPTION

Figure 1:
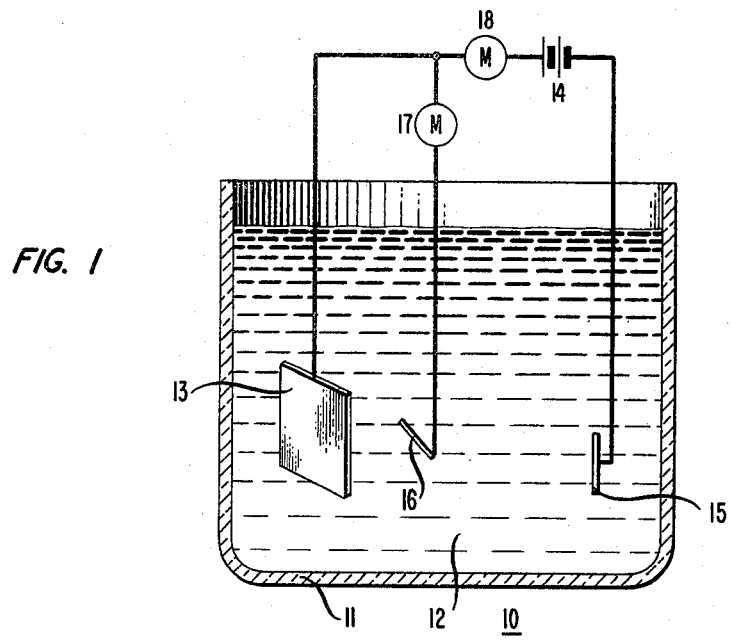
FIG. 1 shows an apparatus useful in the practice of the invention.

The invention in its broadest sense depends on the discovery that highly directional etching can be achieved using an electrochemical photoetching procedure and that this etching procedure is damge-free as far as degradation of semiconductor properties close to the etched region. Such damage-free processing is highly advantageous for various kinds of semiconducting optical devices, including for example, detectors, lasers, light-emitting diodes, etc.

The electrochemical photoetching procedure applies to a certain class of semiconductors, namely compound semiconductors including III-V and II-VI compound semiconductors. Typical semiconductors are CdS, CdSe, HgCdTe, GaP, GaAs, AlAs, AlP, AlSb, InSb, InAs, InP, GaInAs, GaInP, GaInAsP, GaAlP and GaAlAs. Both intrinsic and n-type materials may be etched by the inventive process. Intrinsic semiconductors refer to a class of semiconductors where the number of holes and electrons are nearly equal (usually within a factor of 100).

Intrinsic semiconductors include undoped semiconductors and compensated semiconductors (semiconductors doped with traps to compensate for impurities or other dopants). Typically, such semiconductors are semi-insulating with resistivities greater than $10^6$ ohm-cm. In some instances, resistivities are greater than $10^7$ or even $10^8$ ohm-cm. Often, such materials are useful for substrates because of their semi-insulating characteristics.

Also included are n-type compound semiconductors where electrons exceed holes. Usually n-type semiconductors are obtained by doping with donors (i.e., sulfur, selenium or tellurium) for group V elements or silicon for group III elements. Typical doping levels are $10^{15}$ to $10^{19}$ atoms per cubic centimeter, with $10^{16}$ to $10^{18}$ atoms per cubic centimeter preferred for many applications. The process is useful on compound semiconductors where radiation of a particular energy has a significant effect on the hole carrier population in the valence band. In general, this means hole carrier population should not exceed electron carrier population in the unirradiated compound semiconductor by more than a factor of 100.

For convenience, the etching process may be described in three parts: the electrochemical part, the irradiation part, and the nature of the electrolytic solution used in the process.

In broad terms, the compound semiconductor to be etched is made part of an oxidation-reduction electrochemical process with the compound semiconductor made the anode and an inert material made the counterelectrode or cathode. Typically, the cathode is an inert metal such as platinum or platinized titanium although a wide variety of materials may be used.

An electrical power source (battery or electronic power supply) is used to adjust the potential on the compound semiconductor to a range to be discussed below and to supply power for the oxidation-reduction reaction. In addition, a standard electrode (usually an SCE electrode) is used to measure the potential on the compound semiconductor.

An understanding of the invention is facilitated by reference to FIG. 1. Here, the electrochemical part of the process is illustrated. The apparatus 10 is made up of a vessel 11 containing the electrolytic solution 12 and the semiconductor, to be etched, 13. A power supply 14 is used to supply energy for the oxidation-reduction reaction. Oxidation or etching takes place on the compound semiconductor 13 and reduction on the counterelectrode 15 or cathode. The potential supplied by the power supply 14 may be varied and measured by means of a saturated calomel electrode 16. The potential is measured by means of a voltmeter 17 and the current by means of an ammeter 18. In the general electrochemical photoetching process, the surface of the compound semiconductor is illuminated with radiation as described below.

The potential on the compound semiconductor to be photoetched is particularly important because too high a potential will lead to etching in the absence of radiation and too low a potential will prevent any etching even in the presence of radiation. As a general criteria, the potential should be between the maximum potential of the valence band in the particular electrolytic solution being used and the minimum potential of the conduction band under these same conditions. Often these various potentials are known or can be found from various literature references. Typical values for n-type InP are −0.5 to +1.0 with a preferred range of −0.1 volts to +0.5 volts on the SCE scale in one molar hydrochloric acid with about +0.2 volts most preferred for etching. For n-type GaAs, the range is −0.7 to +1.0 with a preferred range of −0.4 to +0.4 volts, again in hydrochloric acid with about 0.0 volts most preferred for etching. Generally, the preferred potentials may vary about ±0.1 volts. Generally, these potentials shift negatively about 60 millivolts per pH unit in going from acidic to basic solution.

More accurately, the potential should be between the valence band maximum and the flat band potential. The maximum range for potential is where the flat band potential is close to or equal to the conduction band minimum as is the case for n-type materials. For intrinsic materials, the flat band potential is near the outer of the band gap.

Where the relevant potentials are not known or where more accurate potentials are desired, a direct measurement of these quantities can be made by taking a voltammogram of the particular compound semiconductor. Here the current in a typical electrochemical setup described above is measured as a function of the potential applied to the compound semiconductor. This is done both with and without radiation. It is found that in one region of potential, high etching rates are observed (as evidenced by high currents) with radiation and essentially no etching (near zero current) without radiation. It is this region of potential which is of interest in the electrochemical photoetching process. The potential where etching occurs without radiation is at potentials positive of the valence band potential maximum; the potential where this occurs with radiation is approximately conduction band minimum for n-type materials. For intrinsic materials, the potential is the flat band potential located usually halfway between valence band maximum and conduction band minimum.

Figure 2:
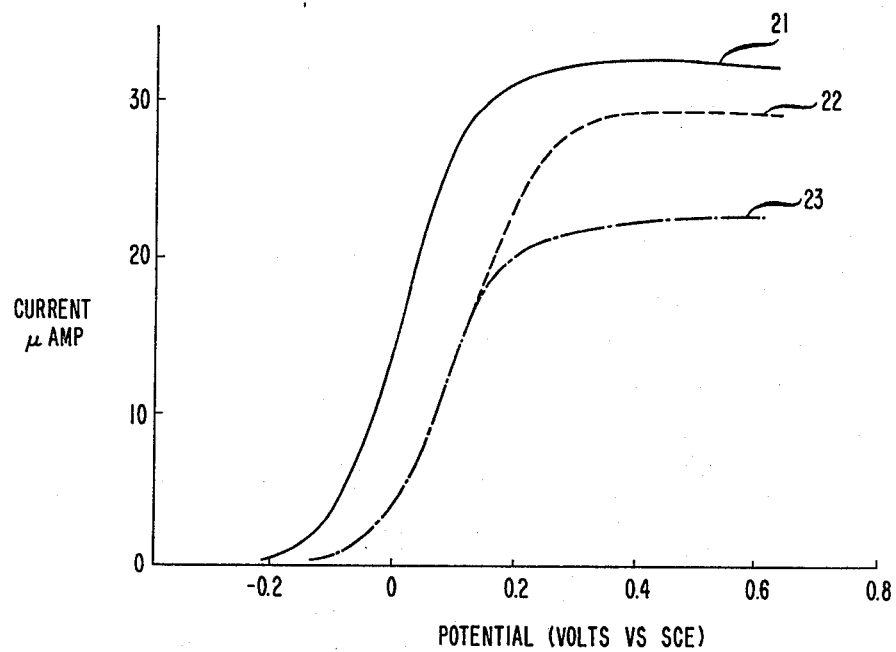
FIG. 2 shows a graph of etch rate versus bias voltage, with light for a typical compound semiconductor in an acid solution.

A typical voltammogram with radiation from a helium-neon laser (wavelength 6328 Angstroms) is shown in FIG. 2. These measurements were carried out on three orientations of n-type InP using a helium-neon laser for radiation. The doping density was approximately $10^{16}$ atoms/cc. The measurements were carried out in a one molar hydrochloric acid solution. The laser power was approximately 110 microwatts. The different curves apply to different crystalline orientations, namely curve 21 to etching on the (100) face, curve 22 to etching on the (111) face and curve 23 to etching on the ($\bar{1}\bar{1}\bar{1}$) face. Only the part of the voltammogram with radiation is shown, without radiation, the curve is displaced toward more positive potential by about 1.4 volts. As can be seen, as the potential increases from approximately −0.2 volts, the current increases and reaches a maximum at approximately 0.2 volts. The current is a measure of the rate of electrochemical photoetching. It should be noted that the amount of current (etching rate) at the plateau maximum does not depend on potential but is only proportioned to the light intensity incident on the compound semiconductor. It is this property of the electrochemical photoetching process that makes possible the production of a large variety of geometrical shapes on compound semiconductors. Similar curve to the one shown in FIG. 2 are obtained in aqueous HF solution, aqueous HBr solution and with other compound semiconductors such as GaAs and GaAlAs. Etching in the absence of radiation for n-type InP generally occurs at about +1.0 volts. Usually, the electrochemical photoetching process is best carried out at a voltage on the flat portion of the voltammogram but far away from where etching takes place without the radiation. For example, for n-type InP, this is at a potential of approximately +0.2 volts. Here, the advantages of etching without any sensitivity to potential are obtained and the amount of etching in the absence of radiation is minimized. Put in another way, the etching is most sensitive to radiation intensity and least sensitive to applied potential.

Irradiation is used to create holes in the valence band. Generally, the energy of the radiation should be great enough to accomplish this. Theoretically, the photon energy of the radiation should be at least as great as the band gap of the semiconductor. In some cases, less energy can be used because of occupied states (due to impurities, doping elements, compensation elements, crystal imperfections, etc.) in the band gap. However, the process is most easily and rapidly carried out with radiation of energy greater than the band gap of the compound semiconductor. Both broad-band and monochromatic radiation may be used.

A particular advantage of the process is that the rate of etching is proportional to the light intensity. Thus, various geometrical shapes may be etched by suitable light intensity distribution and light-ray direction. For example, a straight-walled hole or channel can be made using collimated light and a mask to limit the light to the area to be etched.

A particularly important part of the invention is the nature and composition of the electrolytic solution. A general requirement for the electrolytic solution is that it be sufficiently conductive to permit reasonable electrochemical photoetch rates. Generally, a conductivity greater than 0.0001 mhos/cm is sufficient to meet this requirement; greater than 0.01 mhos/cm is preferred. Although this requirement may be met by the introduction of salts such as potassium nitrate, etc., it is usually met by the presence of other chemicals used to remove the oxidation products of the compound semiconductor being etched.

Another requirement easily stated but less easily put in practice is that the electrolytic solution should not interfere in a detrimental way with the oxidation-reduction electrochemical reaction or the irradiation procedure. Generally, this indicates that the components of the electrolytic solution not be subject to oxidation or reduction at the potentials at any of the electrodes and not be opaque (i.e., not excessively absorb) the radiation used in the process. Under special conditions, it might be convenient or advantageous to introduce a mild oxidizing agent to the electrolytic solution so that reduction at the cathode takes place more easily. A similar situation might be obtained for a mild reducing agent but for the most part stability to the electrochemical conditions at the anode (semiconducting material) and cathode (counter-electrode) is preferred. In general, the reduction at the cathode involves the reduction of water to form hydrogen gas.

For example, a number of acids might be used in the practice of the invention but generally the acids HNO$_3$ and HI would be avoided because of the possibility of reducing HNO$_3$ or oxidizing HI.

The most critical requirement of the electrolytic solution is that it removes the oxidation products of the photoetching process rapidly and in such a way as to not limit the etching rate. Although high solubility of these oxidation products is certainly important, it is believed that near equality (and perhaps rapidity) in the dissolution rate of the various oxidized species is highly desirable. Both acids and bases may be used to accomplish this end, generally with pH values less than 5 or greater than 9. Preferably, the pH should be less than 3 or greater than 11 because of faster rates obtained. The alkaline solutions are usually made for the addition of alkaline agents such as sodium hydroxide or potassium hydroxide. Chelating agents may also be useful for insuring rapid removal of the oxidation products of the etching procedure and may also be used to change the potential of the conduction band minimum and valence band maximum.

In general, best results are obtained where the rate of dissolution of the oxidizing products of the various elements in the compound semiconductor are approximately the same. It has been found that the halogen acids HF, HCl, and HBr yield best results. These acids not only produce rapid etching but are also extremely stable with the potential used in the electrochemical photoetching procedure. Sulfuric acid solutions also yield excellent results with some compound semiconductors (i.e., GaAs) but should usually be avoided with compound semiconductors containing indium (i.e., InP).

The concentration of acid may vary over wide limits including from about 0.05 molar to 10 molar but best results are usually obtained in the range from 0.2 to 2.0 molar. In addition, for the most part, hydrochloric acid is preferred because of its stability, rapid etching, and the minimum damage obtained in the fabrication optical devices. In general, the etching rate may vary over wide limits but usually rates between 1 and 150 milliampere per square centimeter yields excellent results.

Figure 3:
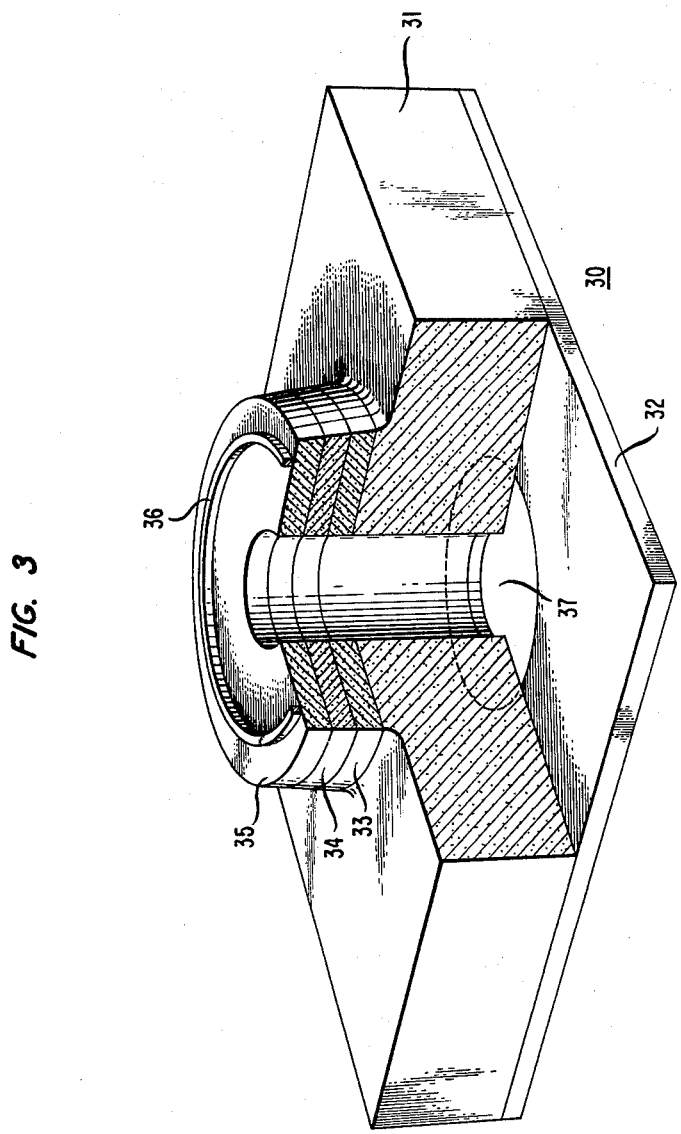
FIG. 3 shows a side view of a photodetector with a hole in it made in accordance with the invention.

FIG. 3 shows a photodiode structure useful for a variety of applications including as a bidirectional optical communication system and as a monitoring system for sources (generally lasers) in optical communication systems. In such a communication system or monitoring system, an optical fiber would be used in which the end portion was made up of a thin section and a thicker section. The thin section fits through the hole in the photodiode and transmits the optical signals from the source. The thicker section contains optical signals or radiation that is detected by the photodiode. The importance of damage-free etching and highly directional etching can be seen from the figure since either damage outside the hole or variation from straight-sided walls will reduce the sensitivity of the photodiode.

The photodiode structure shown in FIG. 3 will now be described in detail. The photodiode 30 is made up of n+-doped InP 31 (the 100) face) with a metallic layer 32 on the bottom face. The diameter of the opening in this metal layer is usually about 500 μm. This metallic layer is usually made of gold alloy such as gold-tin. The n+-InP is substrate material doped to a net carrier concentration of about $10^{18}$ donor atoms/cubic centimeter. On top of the n+-InP is a thin layer of n-type InP 33 about 10 μm thick and then a thin layer (about 1.0 μm thick) of n-type InGaAs 34. On top of this is a thin layer (about 1.5 μm) of p+-type InGaAs 35. These thin layers are generally put on by liquid phase epitaxy and the composition of the InGaAs is about 53 mole percent indium, 47 mole percent gallium for sensitivity to about a wavelength of 1.7 μm. Towards the middle of the top of the photodiode structure is a metal ring 36 generally made of a gold alloy such as gold-zinc. This type of structure is generally referred to as a mesa p-i-n photodiode. The mesa diameter is about 430 μm. Through the middle of this structure is a hole 37 usually with a diameter of about 150 μm made in accordance with the invention. The particular advantages of this structure is its use in a two-way communication system or a monitoring system for an optical source. In optical fibers with a thin portion and a thick portion will fit into the hole 37 so that the photodetector can detect radiation on the outside part of the fiber and optical signals such as pulses can be sent in the opposite direction through the thin fiber.

The invention is particularly well illustrated by describing a specific application, namely etching the hole in the photodiode structure shown in FIG. 3. Usually, the hole is put in the photodiode structure while it is in wafer form and before separation into individual devices. Thus, many photodiodes are processed simultaneously but the description will be directed to a single photodiode structure. The structure is built up by conventional means (generally liquid phase epitaxial deposition of layers on n-type InP crystals) and metal layers are deposited (i.e., gold, zinc, gold and gold, tin, gold layers). The structure is much like that shown in the figure except no hole is present and the opening in the bottom gold alloy layer is only as wide as the hole to be made (150 μm). This gold-alloy layer with the 150 μm opening is conveniently made by electroplating, evaporation or sputtering with photoresist masks on the substrate surface. The gold-alloy layer with 150 μm opening is mask for the photoetching process.

Prior to photoetching, the surface is cleaned generally by etching for 60 seconds in a solution of one part (by volume) hydrogen peroxide, one part sulfuric acid and 10 parts water. The wafer is then immersed in a one molar aqueous hydrochloric acid solution and made part of an electrochemical set-up much like that shown in FIG. 1. Also used is an HF solution, typically 0.75 molar HF and 0.75 molar KF. A piece of platinum metal is used as the cathode. Since straight-sided walls are desired in the etched holes, collimated light is used. A tungsten light bulb is used and lenses to collimate the light and concentrate the light on the area of the surface where it is required. A potential of +0.2 volts is used and etching is observed by the current measured in the circuit. Etching proceeds until the hole extends to the p+-InGaAs layer. In some applications, this p-type layer may be left as is but in this particular case, the p-layer is also etched. This requires another process (since the inventive procedure only etches n-type or intrinsic material).

A number of processes may be used to etch the p-type layer including use of an ordinary chemical etch, increase of the potential to where etching occurs even in the dark (usually greater than about +0.5 volts for p-type InGaAs) or using alternating oxidizing and reducing pulses as disclosed in U.S. patent application Ser. No. 223,356, filed Jan. 8, 1981. Here, the less metallic (more electronegative) element (the group V element in a III-V compound or group VI in a II-VI compound) is reduced in the presence of radiation and dissolved in or carried away by the solution used. The semiconductor is then electrochemically oxidized so as to oxidize the more metallic (more electropositive) element (the group III element in a III-V compound or group II element in a II-VI compound).

In the example given above, a chemical etch was used (one part bromine, 100 parts methanol) which completed the hole by etching through the p-type InGaAs layer. The excess metal on the back (used for the mask) is etched away to an opening of 500 μm diameter. A photoresist material was used to locate the metal to be etched away and limit the diameter to 500 μm.

Observation of the hole indicated very straight walls. Analysis of dark current, breakdown voltage and photoresponse showed a minimum of damage due to the photoetching process. Also, sensitivity was measured as a function of position on the photodiode and no degradation in device performance was found even very close to the etched hole.

Other devices may be made using the same process and with different compound semiconductors. For example, shorter wavelength photodiodes may be made with essentially the same structure. Typically, GaAs is used with various ternary or quaternary compounds to make devices such as photodiodes sensitive at higher energies or even in the visible.

What is claimed is:

1. A process for fabricating a device comprising at least one intrinsic or n-type compound semiconductor comprising the step of electrochemically photoetching at least part of the surface of the compound semiconductor to produce oxidized species by passing current through the compound semiconductor, an electrolytic solution with conductivity greater than 0.0001 mhos/cm and a cathode characterized in that the step further comprises
   a. applying a potential to the semiconducting compound which is between the maximum potential of the valence band of the semiconductor compound in the electrolytic solution and the minimum potential of the conduction band of the semiconductor compound in the electrolytic solution;
   b. illuminating the part of the surface of the compound semiconductor to be etched with radiation of sufficient energy to produce holes in the valence band;
   c. including in the composition of the electrolytic solution species which remove the oxidized species from the surface of the compound semiconductor.

2. The process of claim 1 in which the compound semiconductor is a III-V compound semiconductor.

3. The process of claim 2 in which the compound semiconductor is selected from the group consisting of GaP, GaAs, AlAs, AlP, AlSb, InSb, InAs, InP, GaInAs, GaInP, GaInAsP, GaAlP and GaAlAs.

4. The process of claim 1 in which the compound semiconductor is a II-VI compound semiconductor.

5. The process of claim 4 in which the compound semiconductor is selected from the group consisting of CdS, CdSe, HgCdTe.

6. The process of claim 1 in which the compound is n-type InP and the potential of the SCE scale is between $-0.5$ and $+1.0$ volts in one molar hydrochloric acid.

7. The process of claim 6 in which the potential is between $-0.1$ and $+0.5$ volts.

8. The process of claim 1 in which the compound semiconductor is n-type GaAs and the potential is between $-0.7$ and $+1.0$ volts on the SCE scale in one molar hydrochloric acid.

9. The process of claim 8 in which the potential is between $-0.4$ and $+0.4$ volts.

10. The process of claim 1 in which the pH of the electrolytic solution is greater than 9.

11. The process of claim 10 in which the pH is greater than 11.

12. The process of claim 1 in which the pH of the electrolytic solution is less than 5.

13. The process of claim 12 in which the pH is less than 3.

14. The process of claim 13 in which the electrolytic solution comprises an acid selected from the group consisting of HF, HCl and HBr.

15. The process of claim 14 in which the acid is HCl.

16. The process of claim 14 in which the acid concentration varies from about 0.05 to 10 molar.

17. The process of claim 16 in which the concentration range of the acid is between 0.2 and 2.0 molar.

18. The process of claim 1 in which the electrolytic solution contains salts to improve conductivity.

19. The process of claim 1 in which the compound semiconductor is intrinsic.

20. The process of claim 1 in which the compound semiconductor is n-type.

21. The process of claim 20 in which the doping level is between $10^{15}$ and $10^{19}$ atoms per cubic centimeter.

22. The process of claim 1 in which the energy of the radiation is greater than the band gap of the compound semiconductor.

23. The process of claim 1 in which the device is a photodiode.

24. The process of claim 23 in which the photodiode has an n-type InP substrate, with a thin layer of n-type InP then a thin layer of n-type InGaAs and then a layer of p-type InGaAs.

25. The process of claim 24 in which a hole is photoetched in the center of the photodiode structure n-type layer and intrinsic layer by electrochemical photoetching with a potential of $0.2 \pm 0.1$ volts on the SCE scale and an electrolytic solution comprising one molar hydrochloric acid.

26. The process of claim 25 in which the p-type layer is etched with a chemical etch.

* * * * *